United States Patent [19]
Freiberger

[11] Patent Number: 5,219,791
[45] Date of Patent: Jun. 15, 1993

[54] TEOS INTERMETAL DIELECTRIC PRECLEAN FOR VIA FORMATION

[75] Inventor: Philip E. Freiberger, Santa Clara, Calif.

[73] Assignee: Intel Corporation, Santa Clara, Calif.

[21] Appl. No.: 712,119

[22] Filed: Jun. 7, 1991

[51] Int. Cl.[5] ............... H01L 21/18; B23P 15/00; B44C 1/22
[52] U.S. Cl. ............... 437/195; 437/946; 437/981; 437/238; 156/644; 156/646; 156/650; 156/653
[58] Field of Search ............... 156/643-659; 437/228, 195, 946, 981; 148/DIG. 17

[56] References Cited

U.S. PATENT DOCUMENTS

| | | | |
|---|---|---|---|
| 4,176,003 | 11/1979 | Brown et al. | 156/657 |
| 4,872,947 | 10/1989 | Wang et al. | 156/653 |
| 4,956,035 | 9/1990 | Sedlak | 156/659.1 |
| 4,980,301 | 12/1990 | Harrus et al. | 437/62 |
| 5,091,049 | 2/1992 | Campbell et al. | 156/643 |

FOREIGN PATENT DOCUMENTS 3-291936 12/1991 Japan ............... 437/228

OTHER PUBLICATIONS

"Sixth International IEEE VLSI Multi-Level Interconnection Conference," A Single Pass, In situ Planarization Process Utilizing TEOS for Double Poly, Double Metal CMOS Technologies, by Sunil Mehta & Gian Sharma, 1989.
1989 VMIC Conference of IEEE, In-situ Planarization of Dielectric Surfaces Using Boron Oxide, by Jeffrey Marks, Cam Lau and David Wang, Applied Materials, Santa Clara, Calif.

Primary Examiner—Olik Chaudhuri
Assistant Examiner—H. Jey Tsai
Attorney, Agent, or Firm—Blakely, Sokoloff, Taylor & Zafman

[57] ABSTRACT

A method of precleaning a TEOS oxide layer of a semiconductor device formed by a dep-etch process in order to promote photoresist adhesion to the TEOS oxide layer. The method comprises exposing the TEOS oxide layer to a solution comprising: NH$_4$F, buffered HF, and ethylene glycol.

10 Claims, 2 Drawing Sheets

TEOS INTERMETAL DIELECTRIC PRECLEAN FOR VIA FORMATION

BACKGROUND OF THE INVENTION

1. Field of the Invention

This invention relates to the field of semiconductor circuit manufacturing, and more specifically, to a method of precleaning an intermetal dielectric layer to promote photoresist adhesion during a via hole formation.

2. Prior Art

Large scale integrated semiconductor circuits have multiple layers of conducting films interconnecting the various devices located on a semiconductor substrate. Modern integrated circuits known as multilevel integrated circuits typically have at least two metal layers and the most advanced have three or more: the first level of metalization (metal 1) provides for local interconnects while the later metalization layers (metal 2 or metal 3, etc.) provide for longer interconnects, (i.e., across the entire chip). The conducting layers are normally separated by an intermetal dielectric layer consisting of an oxide, such as $SiO_2$, which acts to isolate the electric potential of the individual conducting layers.

When it is desired to electrically couple conducting lines of different metal layers, a multilevel interconnect is formed. When this is the case, a hole is etched through the intermetal dielectric layer at the location the interconnect is desired. When the upper metal layer (metal 2 or 3 or 4) is subsequently deposited, it is able to form a contact with the lower level metal (metal 1 or 2 or 3) at the desired location. Such holes formed in intermetal dielectric layers are commonly referred to in the art as "via holes". Processes for etching via holes are well known in the art.

Most processes for etching via holes can be broken into three distinct groups: wet etching processes, dry etching processes, and wet/dry etching processes. Each technique has its inherent benefits and short comings. The choice of which process to use is typically dictated by the following considerations: the size of the vias to be formed, the packing density of the vias, the cost of manufacturing the vias, and the desired reliability of the vias.

Wet etching found widespread acceptance in early semiconductor manufacturing. Wet etching of vias into an intermetal dielectric such as $SiO_2$ is typically accomplished using various HF solutions. (HF readily attacks $SiO_2$ at room temperature.) A problem with wet etching is that its processes are generally isotropic in nature. That is, there is as much etching in the horizontal plane as there is in the vertical plane. An advantage of the isotropic nature of wet etching is that the formed metal contacts are very reliable since the vias have a "tapered" or rounded profile and therefore allow for excellent metal step coverage. A disadvantage of the isotropic nature of wet etching, however, is mask undercutting. The undercutting makes wet etching inappropriate for defining features spaced less than 3 microns wide. Another problem with wet etching is that the photoresist or masking material used to define the via location must adhere well during chemical etching to ensure proper patterning. Wet etching processes are inadequate for making small dimensioned vias necessary for modern high device density integrated circuits.

Dry etching is another well known method of etching via interconnections into intermetal dielectric layers. Dry etching techniques include physical sputter etching, reactive ion etching, and plasma etching. Dry etching techniques yield a much more anisotropic (non-isotropic) etch than do wet etching techniques. That is, dry etching forms contact holes with nearly vertical side walls. Dry etching techniques are very useful for generating high density vias because they result in very little undercutting of the resist mask (i.e., they reproduce the features on the resist mask with fidelity). Since dry etching creates vias with nearly vertical sidewalls, poor metal step coverage may result and unreliable contacts may be formed. To ensure reliable metal contacts, therefore, tungsten plugs are necessary to fill the vias. Such processes are extremely expensive and process intensive.

In order to generate modern size multilevel interconnects or vias in a cost effective and reliable manner, a third technique known as wet/dry etching has been developed. In wet/dry etching techniques a wet etch is used first to isotropically etch the top portion of the via, and then a dry etch is used to anisotropically etch the remainder of the via. This technique encompasses the benefits of both wet and dry etching by forming a via with tapered sidewalls at the top and vertical sidewalls at the bottom. The tapered sidewalls at the top ensure good metal step coverage necessary for reliable contacts. Thus, the need for expensive and process intensive tungsten plugs is eliminated. Additionally, the vertical sidewalls at the bottom of the via allow the manufacturing of vias with dimensions of less than one micron. Hence, wet/dry etched vias can be closely packed, which is a necessity for modern high device density integrated circuits.

Another important consideration in the fabrication of modern multi-level interconnect semiconductor circuits is the intermetal dielectric and its method of fabrication. First, the dielectric layer must be able to electrically and physically isolate one level of a conductor (metal 1) from another in a multi-level interconnect system. A good intermetal dielectric layer, therefore, should exhibit good physical and electrical characteristics such as dielectric constant, adhesion to metal, and moisture absorption. Secondly, a good dielectric must also be able to be formed pin hole free and at low temperatures in order to be compatible with low melting point metals, such as aluminum, which will already be present on the wafer when the intermetal dielectric layer is formed.

The intermetal dielectric layer must also be able to be formed between spaces less than one micron without void formation due to cusping. This is because in modern integrated circuits, the spacing between metal lines of a particular metalization level has decreased in order to increase device density. Modern circuits have metal lines spaced less than one micron. These close steps are susceptible to creating voids in the dielectric when the dielectric is formed. Void formation adversely affects device reliability.

Also essential in the manufacturing of multi-level interconnect devices is the planarization of the resultant intermetal dielectric layer. Planarization is necessary because as the number of levels in interconnect technology is increased, the stacking of the additional layers on top of one another produces a more and more rugged topography. This is especially a problem for technologies which employ two levels of polysilicon such as the manufacturing of EPROMs or EPLDs. Poor topography in such devices can result in poor metal step coverage of metal lines, metal stingers, and poor optical lithography. A planar dielectric surface, therefore, is essential for the fabrication of reliable electrical connections in multi-level interconnect systems.

One of the few present dielectrics which exhibit good physical and electrical characteristics, as well as planar topographies without void formation in the smallest cross sectional areas, are "dep-etch" intermetal dielectrics. Such dielectrics are well known in the art. For instance, an article published in the 1989 proceedings of the *Sixth International IEEE VLSI Multi-Level Interconnection Conference* entitled "A Single Pass, In-situ Planarization Process Utilizing TEOS for Double-Poly, Double-Metal CMOS Technologies" by Sunil Mehta and Gian Sharma, describes such a dielectric. This technique employs two plasma depositions of TEOS (tetraethyl orthosilicate), a plasma TEOS oxide (PECVD) and a thermal TEOS oxide (THCVD). First, the PECVD oxide is deposited, then an argon sputter etch is used to taper the oxide profile. Next, a second deposition, a thermal oxide deposition, is made which exhibits excellent conformality. This deposition, like the previous deposition, is followed by a dry etch to achieve the desired dielectric thickness. Hence, the process gives rise to the name "dep-etch". An alternative dep-etch process is detailed in "In-situ Planarization of Dielectric Surfaces Using Boron Oxide" by Jeffrey Marks, Cam Lau and David Wang, of Applied Materials of Santa Clara, Calif., published in the 1989 *VMIC Conference of IEEE*, Jun. 12-13. Dep-etch intermetal dielectrics are essential in the fabrication of modern high density multi-level integrated circuits.

Although the "dep etch" technique produces an ideal intermetal dielectric layer for multi-level interconnect integrated circuits, it has an unfortunate and very serious side effect. During the dry etching portion of the dep-etch process, a thin polymer film forms on top of the dielectric layer. The thin film causes poor adhesion between the TEOS(dielectric layer) and a later formed photoresist masking layer used to define the via location. It is essential in the development of modern semiconductor circuits that the photoresist exhibit good adhesion to the intermetal dielectric layer. Poor adhesion can cause sever undercutting, loss of resolution, and possibly even complete loss of pattern.

As discussed above, the most cost effective method of producing reliable, small vias is to use a wet/dry chemical etching process. Resist adhesion, unfortunately, is most important for techniques which employ a wet or chemical etching such as the wet/dry etch. Therefore, in order to make the dep-etch intermetal dielectric formation process compatible with the wet/dry via etch process, photoresist adhesion to the dielectric layer must be improved.

Additionally, even if the more expensive method of dry etching vias and filling them with tungsten plugs is employed, the polymer film can still create problems. Although not as dependent upon resist adhesion as chemical etching techniques, dry etching still requires good resist adhesion to withstand the developing step of the photolithography process. This problem is compounded as via feature sizes shrink to meet the demands of high density integrated circuits.

Various techniques are well known in the art which help promote resist adhesion. For instance, dehydration brakes prior to resist coating, use of resist adhesion promoter such as HMDS, and elevated temperature post bake cycles are all well-known methods to increase resist adhesion. None of these techniques, however, is useful in removing the polymer film formed on the TEOS intermetal dielectric during the dep-etch process and, therefore, none is completely successful in promoting resist adhesion in the present case.

Additionally, presently known wafer cleaning procedures have likewise proved ineffective in removing the polymer film. Conventional chemical cleaning methods are typically performed with a series of acid baths. Acids such as HF and HCl are incompatible with the TEOS intermetal dielectric layer. Since the intermetal dielectric layer is an oxide, the dielectric would readily react with these acids and the integrity of the dielectric would be affected. Additionally, acids such as $H_2SO_4$ are incompatible with metals already present on the water. A cleaning solution is required which will remove the polymer film without significantly etching the TEOS oxide intermetal dielectric layer or affecting materials already present on the wafer.

Thus, what is needed to fabricate less expensive, modern, reliable, high density, multi-level integrated semiconductor circuits is a method to preclean the TEOS oxide and thereby remove the polymer film inadvertently formed during the TEOS dep etch process. Once the polymer film has been removed, good adhesion will result which will allow the use of a wet/dry etching technique for via formation.

SUMMARY OF THE INVENTION

The present invention is a process for precleaning a TEOS oxide intermetal dielectric layer of a multi-level semiconductor integrated circuit formed by a dep-etch process. The process comprises the steps of cleaning the TEOS intermetal dielectric with a solution comprising 0.1% HF, 2.6% $NH_4F$, and 97.3% Ethylene Glycol by weight for approximately three minutes, then water rinsing the TEOS intermetal dielectric layer with deionized water and drying in dry air.

A goal of the present invention is to strip a polymer film from the top of the TEOS intermetal dielectric which develops during the dep-etch process used to form the intermetal dielectric layer. By stripping the polymer film, photoresist is able to adhere well onto the TEOS oxide layer. Strong resist adhesion allows a wet/dry etching technique to be used to to form small, inexpensive, reliable high density interlevel interconnects between different metal layers of a multi-level integrated circuit. Strong resist adhesion to the TEOS oxide layer also allows for very small interconnects to be defined in photoresist during the developing step of the photolithography process.

DETAILED DESCRIPTION OF THE PRESENT INVENTION

The present invention discloses a novel method of precleaning an interlayer dielectric in order to promote resist adhesion during a subsequent via formation. In the following description, numerous specific details are set forth in order to provide a thorough understanding of the present invention. However, it will be obvious to one skilled in the art, that the present invention may be practiced without these specific details. In other instances, well known semiconductor integrated circuit fabrication techniques and concepts have not been set forth in detail in order to not unnecessarily obscure the present invention.

In the process of manufacturing integrated circuits, the first steps are dedicated towards forming the active devices of the circuit. The devices are formed on and in a silicon or semiconductor substrate. The active elements typically include transistors (bipolar and/or MOSFET) and storage devices such as EPROMs and capacitors. The structure and method of fabrication of various active devices is well known in the art of integrated circuit manufacturing. U.S. Pat. No. 4,364,075 entitled "CMOS Dynamic RAM Cell and Method of Fabrication" is an example of a structure and method of fabrication for a CMOS dynamic RAM cell.

Once the active devices have been formed on the semiconductor substrate, they are interconnected in order to form a functional circuit. Since modern semiconductor circuits employ literally millions of transistors, multi-level interconnect systems are required for active device interconnection. Modern circuits typically have at least two metal layers and the most advanced circuits have three or more; the first level of metalization (metal 1) provides for local interconnects, while later metalization layers (metal 2 or metal 3, etc.) provide for longer interconnects (i.e., across the entire chip). The conducting layers are normally separated by intermetal dielectric layers such as $SiO_2$ formed from TEOS which act to isolate the potential of the conducting layers. Sometimes it is desired to interconnect the lines of different layers. When this is the case, a hole is etched through the intermetal dielectric so that when an upper metal layer (metal 2, 3 or 4) is deposited, it can form a contact with the lower level metal (metal 1,2 or 3) at the desired location. Such holes formed in dielectric layers are commonly referred to as via holes.

Figure 1:
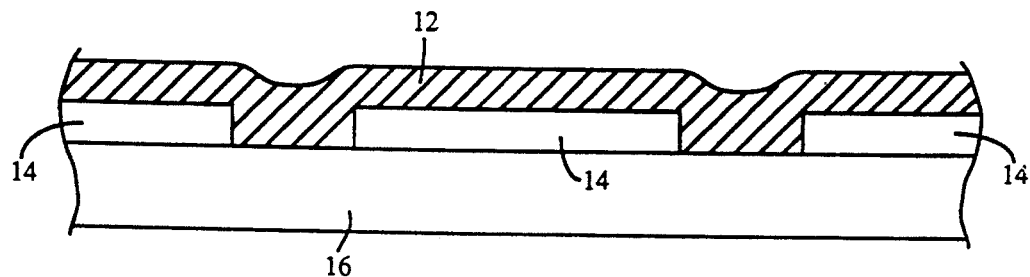
FIG. 1 is a cross sectional view showing a formation of an aluminum layer (metal 1) over a semiconductor material and a dielectric material.

Referring to FIG. 1 of the present invention, a thin film of aluminum or aluminum alloy 12 (metal 1) is deposited to form the local metallic interconnections for the various devices formed on a semiconductor material. The aluminum film 12 is deposited on both an insulating dielectric layer (polysilicon-metal 1 dielectric), such as a high temperature CVD oxide, and on a doped silicon substrate 16. Such deposition to form aluminum contacts is well known in the art. In the presently preferred embodiment of the present invention, between 3,000–10,000 Å thick layer of aluminum with 0.5% copper is deposited by sputtering from an aluminum target. Other well known metalization techniques can also be employed. The aluminum metal layer 12 (metal 1) can also be a multi-layer metal without varying from the scope of the present invention.

Figure 2:
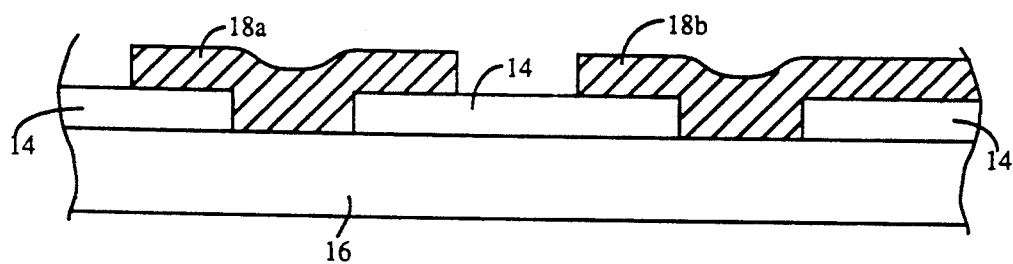
FIG. 2 is a cross sectional view illustrating the patterning of aluminum lines from the aluminum layer (metal 1) on the substrate of FIG. 1.

In FIG. 2, once the metal layer 12 is deposited, it is defined into individual metal lines 18a and 18b with well known processing techniques. For example, reactive ion etching the aluminum film 12 with a gas mixture comprising $Cl_2$, $CF_4$ and $BCl_3$ at approximately 150–250 sccm of total flow at approximately 20–50 millitorr of pressure where the gas mixture has a concentration ratio of $CF_4:Cl_2$ of at least 2:1 is one method for defining the aluminum lines 18a and 18b. The metal lines 18a and 18b interconnect various devices on the semiconductor substrate. The spacing between formed metal lines 18a and 18b can be less than one micron in the present invention.

Figure 3:
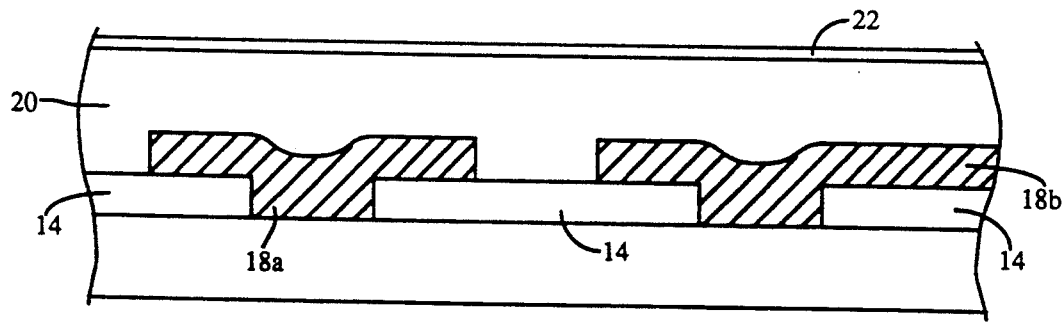
FIG. 3 is a cross sectional view illustrating the formation of a dep etch TEOS oxide intermetal dielectric on the substrate of FIG. 2 and the resultant development of a carbon polymer on the intermetal dielectric layer.

In reference to FIG. 3, an intermetal dielectric layer 20 is next formed over the metal 1 lines 18a and 18b and over the poly/metal 1 dielectric 14. The intermetal dielectric layer provides electrical isolation between the formed aluminum lines 18a and 18b of metal 1, and a subsequently formed conducting layer metal 2. In the currently preferred embodiment of the present invention, a "dep-etch" process is used to form the intermetal dielectric layer 20. Dep-etch processes for forming intermetal dielectric layers are well known in the art.

In the "dep etch" process of the present invention, the first step is the deposition of a TEOS oxide (tetraethyl orthosilicate) which is a combination of a plasma TEOS oxide (PECVD oxide) and a thermal TEOS oxide (THCVD oxide). An Applied Materials Multi-Chamber Precision 5000 System can be used to deposit the composite intermetal dielectric layer. It is a parallel-plate plasma reactor, and the wafer is placed on the grounded electrode. A high frequency of 13.56 MHz is employed. The THCVD film exhibits excellent step coverage and is useful for filling of very small spaces, such as between metal lines 18a and 18b. The PECVD oxide exhibits better electrical and physical characteristics, such as the lack of pin holes and high deposition rate, than does the THCVD oxide.

After the PECVD and THCVD deposit, the formed intermetal dielectric layer is etched by argon sputter etching in a second chamber of the Precision 5000 reactor. The wafer is placed on the powered electrode(cathode). The sputter etch tapers the oxide profile, thereby eliminating void formations in the thick intermetal dielectric layers. The oxide is removed from horizontal surfaces at a rate of about 300 Å/min. Next, a second PECVD deposition is made to provide the bulk of the dielectric. (The THCVD film can still be used if necessary to fill the small spaces.) The final step in forming the intermetal dielectric 20 is a reactive ion etch-back with $CF_4$ which removes an appropriate amount of the oxide intermetal dielectric at about 6000 Å/min until the final desired intermetal dielectric thickness is achieved. The TEOS oxide intermetal dielectric of the present invention is approximately one micron thick.

The resultant intermetal dielectric 20 exhibits excellent physical and electrical characteristics. It is pin hole free. It is able to fill the smallest spaces between metal lines 18a and 18b down to less than a micron without cusping and thereby without forming voids. The dep etch process also results in the very planar topography of the dielectric allowing for more reliable processing of electrical interconnects and later levels of the integrated circuit. Such a dielectric is required in the fabrication of modern high density multilevel semiconductor circuits.

Unfortunately, however, during the intermetal dielectric dep etch process, a thin carbon polymer film 22 develops on the top surface of the intermetal dielectric layer 20. The polymer film is less than 100 Å and is of unknown chemistry. It is believed that the film arises from the etching chemistry of the reactive ion etch. That is, the film arises from the carbon and florin originating from the $CF_4$ used in the reactive ion etch of the dep etch process. It is also believed that aspects of the polymer may possibly come from moisture gathered as wafers sit idly during process flow.

The polymer film 22 adversely affects subsequent photolithography process steps by degrading photoresist mask adhesion to the intermetal dielectric layer. The photoresist must adhere well to the intermetal dielectric layer 20 to ensure reliable processing of subsequent steps. Poor adhesion brings about severe undercutting, loss of resolution and/or the possibility of complete loss of pattern during via formation. Wet etching techniques, like the one used in the present invention demand a high level of resist adhesion to the underlying intermetal dielectric layer. Although dry etching techniques do not demand such strict adhesion requirements, it is to be appreciated that the resist still must adhere well enough to withstand the developing step. Furthermore, as feature sizes shrink, resist adhesion becomes more and more important. The polymer film 22 therefore must be removed in order to fabricate modern, reliable via contacts.

It has been discovered that the polymer film 22 can be removed by precleaning the intermetal dielectric layer 20 with one of several chemical compositions. The preferred embodiment of the present invention utilizes buffered HF, $NH_4F$ and ethylene glycol present in the following proportions by weight: HF, 0.11%; $NH_4F$, 2.6%; and ethylene glycol, 97.33%. It is believed that $NH_4F$ is the agent which removes the carbon polymer, while HF is the agent which etches the oxide. Ethylene glycol acts as a means to dilute the formula. The above formula is known as EG3 and is sold by Image Technology Corporation, a subsidiary of Owen Hunt. The formula is ideal because it removes the polymer while not radically attacking the underlying TEOS oxide (intermetal dielectric) layer. The oxide etch rate of the EG3 formula is approximately 50–100 Å per minute. In order to adequately remove the polymer film, 22 wafers are placed in a bath of EG3 at room temperature for approximately three minutes. When the present invention is used in a production environment, the use of a recirculating bath and filter pump system for the bath is recommended.

Figure 4:
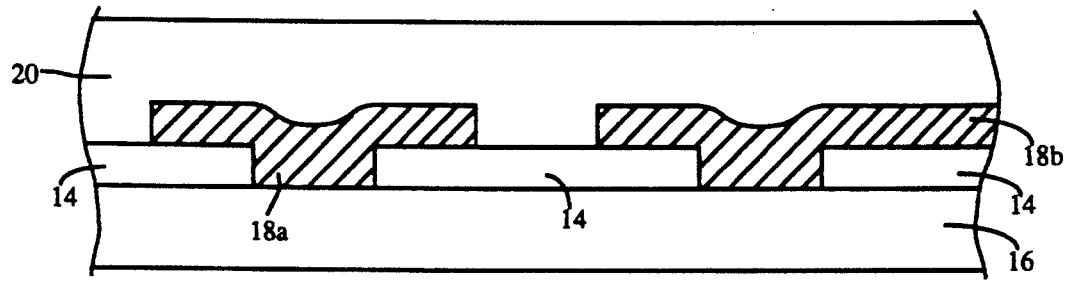
FIG. 4 is a cross sectional view illustrating the removal of the thin carbon polymer film from the TEOS intermetal dielectric layer of FIG. 3.

After removing the polymer film 22 from the intermetal dielectric layer 20, wafers are removed from the recirculating bath and are water rinsed in deionized water (Di water) for approximately five minutes. A spray rinse system is used in the present invention. Next, the wafers are spun dry in a vertex dryer in a nitrogen atmosphere or dried with clean dry air. Referring to FIG. 4, the intermetal dielectric layer is now clean of the carbon polymer film 22.

An alternative precleaning formula for the EG3 formula is EG200. EG200 is comprised of 0.5% buffered HF, 32.8% $NH_4F$ and 67.2% ethylene glycol, respectively by weight. EG200 like EG3 is manufactured by Image Technologies Corporation, a subsidiary of Owen Hunt. The oxide etch rate is approximately 100–200 Å per minute, slightly faster than the EG3 solution because of the increased proportion of HF. Yet another alternative to the EG3 formula for removing the carbon polymer film is the Hashimoto formula (LA15) which is 17% $NH_4F$, 0.04% HF and the remainder Di water. The Hashimoto formula (LA15) exhibits an oxide etch rate of approximately 10–20 Å per minute. The preclean time of LA15 is approximately five minutes. As a final alternative to EG3, one can use 100% $NH_4F$ since it is the reactive agent which removes the polymer film. $NH_4F$ has an oxide etch rate of approximately 200–400 Å per minute. The preclean time of 100% $NH_4F$ is about a half minute to adequately remove the polymer film.

The above formulas are very useful from a manufacturing standpoint. They have prices which are economically reasonable. They also filter cleanly and therefore can be used in recirculating baths, an important production consideration. The formulas are also compatible with layers present on the semiconductor substrate when the cleaning takes place, such as early metal layers and oxides. It should be noted that the proportions of the above solutions can be varied depending upon process requirements to increase or decrease the TEOS oxide etch rate, with the etch rate being mainly dependent on the HF composition.

Figure 5:
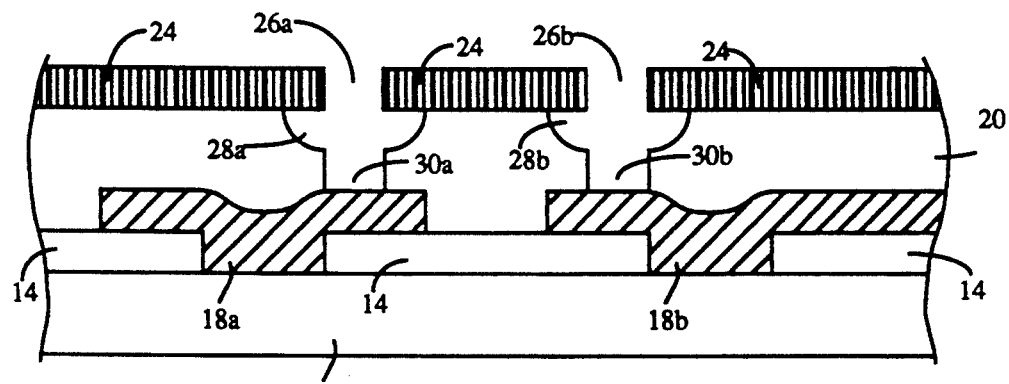
FIG. 5 is a cross sectional view illustrating the formation of a masking layer on the substrate of FIG. 4 and the formation of via holes by wet/dry etching.

Referring to FIG. 5, the TEOS intermetal dielectric layer 20 is next covered with a masking material 24 to define the locations where the interlevel contacts are to be formed. In the present invention the masking material 24 is positive photoresist. It is important to note that the photoresist 24 can be a positive or negative photoresist, an organic or inorganic resist., and a thick or thin resist, without varying from the scope of the present invention. Although the present invention details only a single layer resist for simplicity, a multilayer resist such as one encompassing PMMA would benifet equally well in the present invention without varying from its scope. Additionally, a resist adhesion promoter such as hexamethyldisilazane(HMDS) may also be used as part of the mask without varying from the scope of the present invention. Finally, a nitride mask could be used to pattern the intermetal dielectric 20 instead of photoresist and would likewise benefit from the precleaned TEOS surface of the present invention. In short, any masking material formed on the TEOS intermetal dielectric 20 would benefit from the present invention. The photoresist or masking material 24 adheres well to the underlying intermetal dielectric layer 20 because the thin polymer film 22 has been removed. In the present invention the photoresist 24 is masked, exposed and developed with photolithography techniques well known in the art to define the locations 26a and 26b where via contacts are to be formed.

Next, via holes are etched into the intermetal dielectric layer 20 so that electrical couplings between the aluminum lines 18a and 18b (metal 1) and a subsequently formed metal 2 can be made. In the present invention, a wet/dry etch process is used. First, a wet chemical etch is used to isotropically etch the first part of the via holes 28a and 28b into the intermetal dielectric layer 20. A buffered HF solution with an etch rate of 1900 Å per second is used in the present invention. The isotropic wet etch provides a tapered edge profile to ensure good metal coverage and a reliable metal contact. Since wet etching is being used and small vias are being formed, strong resist adhesion to the TEOS oxide layer 20 is extremely important.

Next, still referring to FIG. 5, the intermetal dielectric layer in the via holes is anisotropically dry etched by reactive ion etching with $CHF_3/O_2$ or other silicon dioxide etching chemistry and an inert gas. An Applied Materials 8310 reactive ion etcher can be used for the dry etching. Other dry anisotropic etchers can also be used. The anisotropic non-tapered dry etching allows for minimum sized contacts 30a and 30b to be formed on the aluminum lines 18a and 18b respectively (metal 1). By using the wet/dry etch process of the present invention, reliable vias with dimensions down to 0.5 to 1.0 microns can be readily and consistently fabricated. Additionally, via to via spacing can be as little as 1.0 micron. Thus, because of the present invention, there is no need to use the expensive via hole technique of dry etching vertical vias and filling with tungsten plugs. It is to be appreciated that without the excellent resist adhesion, due to the removal of the polymer film, the wet etching part of the wet/dry etch process could not handle the small dimensions and high packing densities as are capable with the present invention.

Figure 6:
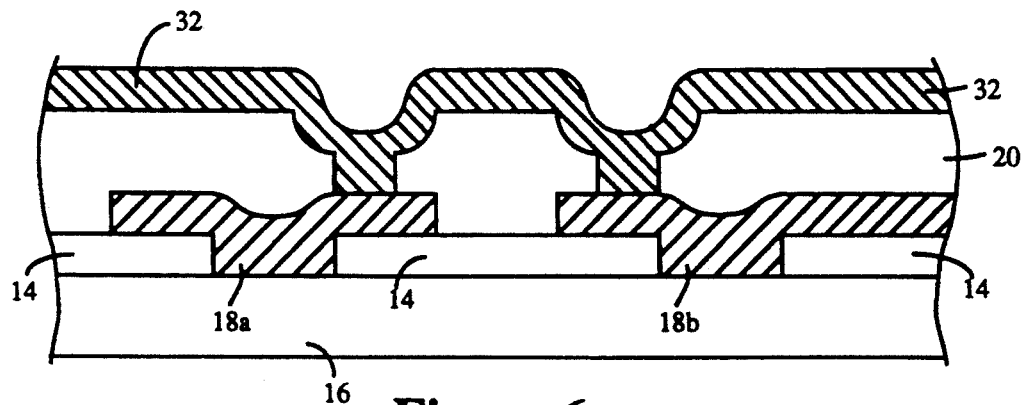
FIG. 6 is a cross sectional view illustrating the formation of a second aluminum layer (metal 2) on the TEOS intermetal dielectric layer and on the first aluminum layer (metal 1) and thereby forming interlevel interconnects.

Referring to FIG. 6, once the via holes have been formed through the intermetal dielectric layer 20 to the aluminum lines 18a and 18b, the photoresist layer 24 is stripped using well known techniques. A second metal layer (metal 2) is formed next. The aluminum layer 32 is sputtered or deposited with well known methods onto the intermetal dielectric 20 and onto the aluminum lines 18a and 18b in the via holes 30a and 30b. The aluminum layer 32 is approximately 8000 Å. The aluminum conducting layer 32 (metal 2) is effectively coupled at a low resistance to the aluminum lines 18a and 18b (metal 1), thereby forming reliable interlevel interconnections.

It is to be stressed that although the present invention describes precleaning a polymer film in relation to promoting resist adhesion for a via hole formation, the present invention is equally useful and applicable for any process step where a TEOS oxide is formed by a dep etch process and is followed by a photoresist lithography step, especially where adhesion is important. For example, the present invention would be applicable in the formation of a TEOS contact for a single crystal silicon. Additionally, although the present invention details interlevel interconnects between metal layers one and two, it is equally applicable to interconnects between higher level metal layers. The present invention could also find application any time a layer of a semiconductor circuit requires strong adhesion to an underlying TEOS oxide formed by a dep etch process.

I claim:

1. A process of forming an interconnect between two metal layers of a multi-level semiconductor integrated circuit comprising the steps of:
    forming a TEOS intermetal dielectric layer with a dep-etch process on a first metal layer of a semiconductor integrated circuit;
    precleaning said TEOS intermetal dielectric layer with a solution comprising $NH_4F$;
    depositing a masking layer on said TEOS intermetal dielectric layer;
    defining a location in said masking layer where the interconnect to said first metal layer is to be formed;
    etching a contact opening into said TEOS intermetal dielectric layer at said location until said first metal layer is substantially revealed;
    removing said masking layer; and
    forming a second metal layer on said TEOS intermetal dielectric layer and on said first metal layer in said contact opening so that an electrical coupling between said first and second metal layers is achieved.

2. The process of claim 1 wherein said solution comprises approximately: 0.1% HF, 2.6% $NH_4F$, and 97.3% Ethylene Glycol by weight.

3. The process of claim 1 wherein said solution comprises approximately: 0.5% HF, 32.8% $NH_4F$, and 67.2% Ethylene Glycol by weight.

4. The process of claim 1 wherein said solution comprises approximately: 0.04% HF, 17% $NH_4F$ and the remainder deionized water by weight.

5. The process of claim 1 wherein said solution comprises: HF, and $NH_4F$.

6. A process of forming a small inexpensive highly reliable multilevel interconnect between two metal layers of a high density multilevel semiconductor integrated circuit comprising the steps of:
    forming a planar TEOS intermetal dielectric layer with a dep-etch process on a first metal layer of the semiconductor integrated circuit wherein a polymer film develops on the surface of said TEOS intermetal dielectric layer during said deep-etch process;
    precleaning said TEOS intermetal dielectric layer with a solution comprising $NH_4F$ in order to remove said polymer film developed during said dep-etch process thereby increasing said TEOS intermetal dielectric layer's adhesion to photoresist;
    depositing a photoresist layer on said TEOS intermetal dielectric layer;
    defining a location in said photoresist layer where the interconnect to said first metal layer is to be formed by masking, exposing, and developing said photoresist layer;
    etching a first part of a contact opening into said TEOS intermetal dielectric layer at said location with a wet chemical etch;
    etching a second part of said contact opening into said TEOS intermetal dielectric layer by dry etching until said first metal layer is substantially revealed;
    removing said photoresist layer; and
    forming a second metal layer on said TEOS intermetal dielectric layer and on said first metal layer so that an electrical coupling between said first and second metal layers is achieved.

7. The process of claim 6 wherein said solution comprises approximately: 0.1% HF, 2.6% $NH_4F$, and 97.3% Ethylene Glycol by weight.

8. The process of claim 6 wherein said solution comprises approximately: 0.5% HF, 32.8% $NH_4F$, and 67.2% Ethylene Glycol by weight.

9. The process of claim 6 wherein said solution comprises approximately: 0.04% HF, 17% $NH_4F$ and the remainder deionized water by weight.

10. The process of claim 6 wherein said solution comprises: HF, and $NH_4F$.

* * * * *

UNITED STATES PATENT AND TRADEMARK OFFICE
CERTIFICATE OF CORRECTION

PATENT NO. : 5,219,791
DATED : June 15, 1993
INVENTOR(S) : Freiberger

It is certified that error appears in the above-indentified patent and that said Letters Patent is hereby corrected as shown below:

Column 3, line 67, replace "brakes" with -- bakes --.

Column 4, line 63, after "dielectric" insert -- layer --.

Signed and Sealed this

Sixth Day of December, 1994

*Attest:*

BRUCE LEHMAN

*Attesting Officer*    *Commissioner of Patents and Trademarks*